(12) United States Patent
Tamma

(10) Patent No.: US 10,996,451 B2
(45) Date of Patent: May 4, 2021

(54) NANOSTRUCTURED META-MATERIALS AND META-SURFACES TO COLLIMATE LIGHT EMISSIONS FROM LEDS

(71) Applicant: Lumileds LLC, San Jose, CA (US)

(72) Inventor: Venkata Ananth Tamma, San Jose, CA (US)

(73) Assignee: Lumileds LLC, San Jose, CA (US)

( * ) Notice: Subject to any disclaimer, the term of this patent is extended or adjusted under 35 U.S.C. 154(b) by 0 days.

(21) Appl. No.: 16/161,875

(22) Filed: Oct. 16, 2018

(65) Prior Publication Data
US 2019/0113727 A1 Apr. 18, 2019

Related U.S. Application Data

(60) Provisional application No. 62/573,372, filed on Oct. 17, 2017.

(30) Foreign Application Priority Data

Feb. 23, 2018 (EP) .................................. 18158381

(51) Int. Cl.
*G02B 19/00* (2006.01)
*H01L 33/58* (2010.01)
(Continued)

(52) U.S. Cl.
CPC ........ *G02B 19/0028* (2013.01); *F21V 7/0008* (2013.01); *F21V 13/04* (2013.01);
(Continued)

(58) Field of Classification Search
CPC . G02B 19/0028; G02B 19/0061; H01L 33/58; H01L 2933/0083; F21V 7/0008; F21V 13/04; F21Y 2115/10
See application file for complete search history.

(56) References Cited

U.S. PATENT DOCUMENTS

| 7,663,084 | B2 | 2/2010 | Toshikiyo et al. |
| 2007/0103782 | A1 | 5/2007 | Lee et al. |

(Continued)

FOREIGN PATENT DOCUMENTS

| EP | 1486803 A2 | 12/2004 |
| EP | 3252834 A1 | 12/2017 |

(Continued)

OTHER PUBLICATIONS

Chong et al., "Efficient Polarization-Insensitive Complex Wavefront Control Using Huygens' Metasurfaces Based on Dielectric Resonant Meta-atoms," (2016).

(Continued)

*Primary Examiner* — Kevin Quarterman

(57) ABSTRACT

A system, method and device for collimating the output of a light emitting diode (LED) are disclosed. The system, method and device include an LED substrate including a top surface from which the light is emitted, and an array of subwavelength scattering antennas positioned within the emitted light path, the array of subwavelength scattering antennas configured to select directions of scatter of the LED emitted light to provide collimated light output from the device. The array may be aligned perpendicular to the plane of propagation of the light emitted from the LED and may be positioned adjacent to the top surface. The array may be at least partially, or completely, positioned within the LED substrate. The array may be spaced a distance from the top surface and the spacing may be achieved using a dielectric spacer adjacent to the top surface. The array may be positioned within the dielectric spacer.

20 Claims, 10 Drawing Sheets

(51) Int. Cl.
*F21V 7/00* (2006.01)
*F21V 13/04* (2006.01)
*F21Y 115/10* (2016.01)

(52) U.S. Cl.
CPC .......... *G02B 19/0061* (2013.01); *H01L 33/58* (2013.01); *F21Y 2115/10* (2016.08); *H01L 2933/0083* (2013.01)

(56) References Cited

U.S. PATENT DOCUMENTS

| | | |
|---|---|---|
| 2009/0236614 A1 | 9/2009 | Puscasu et al. |
| 2010/0176411 A1 | 7/2010 | Suzuki |
| 2012/0002286 A1 | 1/2012 | Tanikawa |
| 2012/0105962 A1 | 5/2012 | Fattal et al. |
| 2013/0286633 A1* | 10/2013 | Rodriguez ............ C09K 11/883 362/84 |
| 2015/0090862 A1 | 4/2015 | Matsui et al. |
| 2016/0135270 A1* | 5/2016 | Earl ....................... H05B 45/00 315/297 |
| 2016/0161644 A1 | 6/2016 | Verschuuren et al. |
| 2016/0190403 A1* | 6/2016 | Verschuuren ......... H01L 33/508 257/98 |
| 2016/0197111 A1 | 7/2016 | Coolbaugh et al. |
| 2016/0302280 A1* | 10/2016 | Harbers ............... F21V 23/006 |
| 2016/0306167 A1 | 10/2016 | Mossberg et al. |
| 2016/0377272 A1* | 12/2016 | Chen ........................ F21K 9/90 362/235 |
| 2017/0082263 A1 | 3/2017 | Byrnes et al. |
| 2017/0082785 A1 | 3/2017 | Verschuuren et al. |
| 2017/0288098 A1 | 10/2017 | Rodriguez et al. |
| 2017/0350563 A1* | 12/2017 | Lunz .................. C09K 11/0883 |

FOREIGN PATENT DOCUMENTS

| | | |
|---|---|---|
| JP | 2001-108812 A | 4/2001 |
| JP | 2004-061905 A | 2/2004 |
| WO | 2017/031366 | 2/2017 |
| WO | 2017/040854 | 3/2017 |
| WO | 2017/053309 | 3/2017 |
| WO | 2017/091738 | 6/2017 |

OTHER PUBLICATIONS

Kuznetsov et al., "Optically resonant dielectric nanostructures," Science, vol. 354, Issue 6314, (Nov. 18, 2016).
The Extended European Search Report corresponding to EP18158381.6, dated Aug. 24, 2018, 7 pages.
International Search Report and Written Opinion corresponding to PCT/US2018/056202, dated Oct. 17, 2017, 12 pages.

* cited by examiner a: Single Array of Scatters on Led Top Surface b: Single Array of Scatters on Led Top Surface with Z Offsets between Scatters c: Multiple Arrays on Led Top Surface without Dielectrics Spacers d: Multiple Arrays on Led Top Surface with Dielectric Spacers between layers of Thickness '$h_1$','$h_2$', etc.

600

700

800

900

1000

1100

NANOSTRUCTURED META-MATERIALS AND META-SURFACES TO COLLIMATE LIGHT EMISSIONS FROM LEDS

CROSS REFERENCE TO RELATED APPLICATION

This application claims the benefit of U.S. Provisional Application No. 62/573,372 filed Oct. 17, 2017, entitled "Nanostructured Meta-Materials and Meta-Surfaces To Collimate Light Emission from LEDS", and European Patent Application No. 18158381.6 filed 23 Feb. 2018, both of which are incorporated by reference as if fully set forth.

FIELD OF INVENTION

The present invention is related to methods of and systems for collimating light emissions from light sources, and more particularly, to nanostructured meta-materials and meta-surfaces to collimate light emission from light emitting diodes (LEDs).

BACKGROUND

A standard light emitting diode (LED) die typically has a Lambertian angular emission pattern regardless of emitted wavelength. For certain LED applications, there may be a benefit or need to substantially collimate the light emitted by LEDs. For example, the light emitted from infrared (IR) LED's used for iris scanning needs to be collimated. The systems used to provide the collimated light emission use lenses coupled to the LEDs to collimate the beam in the far-field. The lenses are used since a typical LED has a Lambertian angular distribution of emitted light, the lenses collimate the light outputted from the LED. Such a lens or other type of optical assembly is generally a different component and/or part from the LED die. This additional part requires integration into the package that holds the LED in place. Often, the lens is a molded plastic part, but the collimating optics can also be a reflective surface or a combination of both reflectors and lenses. The use of an external lens assembly increases the size of the light emitting assembly. For example, for a typical IR LED, the package, which is the LED along with reflector and/or plastic lens, is typically about 3 mm in height. The LED die including the substrate is generally only a few 100 microns thick. The ratio of package thickness to LED die thickness is about 10 for existing commercial IR LEDs. As IR LED's are increasingly being used in smartphones as part of modules, such as iris recognition modules, and smartphones are continuously being made thinner with increasing component density, it is important to reduce the thickness of IR LEDs. A need therefore exists for a technology to allow for LEDs emitting collimated light having a thinner profile, reduce the need for external lenses to collimate light, narrow the radiation profile emitted by LEDs, and to increase efficiency in coupling light to external optics.

SUMMARY

A system, method and device for collimating the output of a light emitting diode (LED) are disclosed. The system, method and device include an LED substrate including a top surface from which the light is emitted, and an array of subwavelength scattering antennas positioned within the emitted light path, the array of subwavelength scattering antennas configured to alter the phase and amplitude of scatter of the LED emitted light to provide collimated light output from the device. The array may be aligned perpendicular to the plane of propagation of the light emitted from the LED and may be positioned adjacent to the top surface. The system, method and device may also include an embedding medium which the array is positioned within. The array may be at least partially, or completely, positioned within the LED substrate. The array may be spaced a distance from the top surface and the spacing may be achieved using a dielectric spacer adjacent to the top surface. The array may be positioned within the dielectric spacer. Alternatively, the array may be a discrete element.

The system, method and device may include a second array of subwavelength scattering antennas positioned within the emitted light path, the second array of subwavelength scattering antennas configured to select directions of scatter of the LED emitted light to provide collimated light output from the device. The array and the second array may be spaced a distance apart. The array and the second array may be the same or different arrays.

BRIEF DESCRIPTION OF THE DRAWINGS

A more detailed understanding can be had from the following description, given by way of example in conjunction with the accompanying drawings wherein.

DETAILED DESCRIPTION

Figure 1:
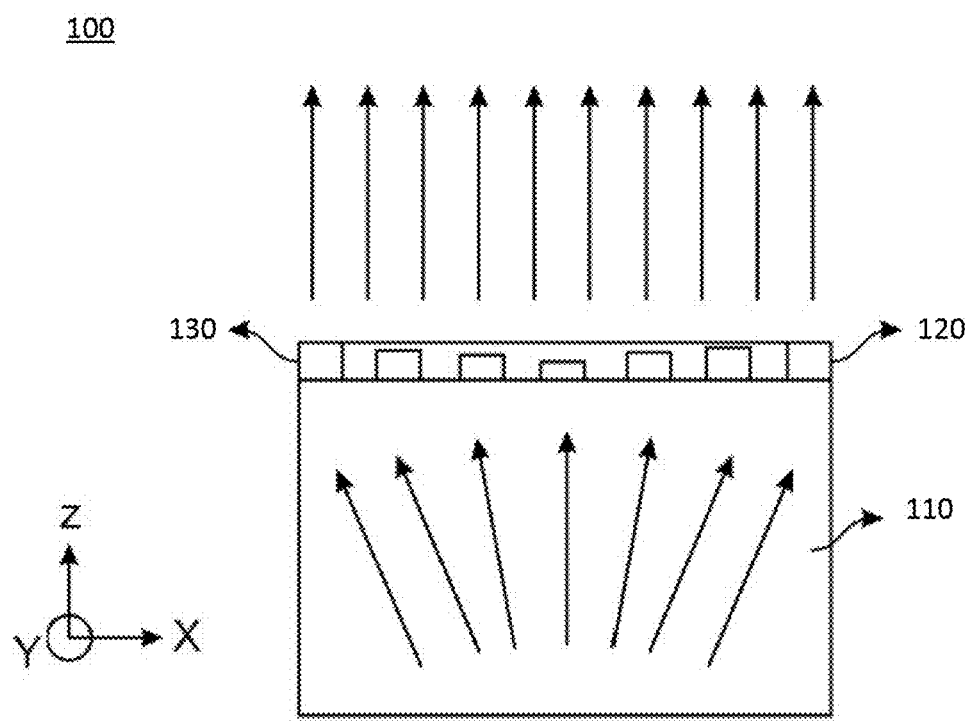
FIG. 1 illustrates an arrangement of subwavelength scattering antennas placed on top of LED die functioning to collimate the light emitted by the LED in the far-field.

In the following description, numerous specific details are set forth, such as particular structures, components, materials, dimensions, processing steps, and techniques, in order to provide a thorough understanding of the present embodiments. However, it will be appreciated by one of ordinary skill of the art that the embodiments may be practiced without these specific details. In other instances, well-known structures or processing steps have not been described in detail in order to avoid obscuring the embodiments. It will be understood that when an element such as a layer, region, or substrate is referred to as being "on" or "over" another element, it can be directly on the other element or intervening elements may also be present. In contrast, when an element is referred to as being "directly on" or "directly" over another element, there are no intervening elements present. It will also be understood that when an element is referred to as being "beneath," "below," or "under" another element, it can be directly beneath or under the other element, or intervening elements may be present. In contrast, when an element is referred to as being "directly beneath" or "directly under" another element, there are no intervening elements present.

In the interest of not obscuring the presentation of embodiments in the following detailed description, some structures, components, materials, dimensions, processing steps, and techniques that are known in the art may have been combined together for presentation and for illustration purposes and in some instances may have not been described in detail. In other instances, some structures, components, materials, dimensions, processing steps, and techniques that are known in the art may not be described at all. It should be understood that the following description is rather focused on the distinctive features or elements of various embodiments described herein.

Artificially structured, sub-wavelength, nanostructured optical meta-materials, meta-surfaces and photonic crystals with spatial variation of nano-scale structural and chemical properties collimate light emitted from planar light emitting devices such as light emitting diodes (LEDs) to provide flat, ultra-thin, compact LEDs capable of emitting collimated light into the far-field without the use of reflector and/or lens assembly. In certain applications, such as camera phones and miniaturized personal electronics devices, the thickness of LED's with reflectors and lens can be an important limitation. The present collimation optics may be built on the LED chip itself instead of requiring a separate optical assembly.

The proposed method reduces the thickness of LEDs (not limited to IR LEDs but also applicable to visible LEDs) by incorporating subwavelength nanostructures into the LED architecture. The subwavelength nanostructures may be sized smaller than free space wavelength of light in lateral size (x,y), and the z-height, along direction of propagation may or may not be sub-wavelength. For resonant implementations, z may also be subwavelength. For the non-resonant implementations, z may be subwavelength or may be approximately one wavelength in size. Subwavelength references a reference wavelength, such as at a specified design wavelength. These subwavelength nanostructures affect the amplitude and phase of the light illuminating them and cause the light transmitted or scattered by an array or arrays of the nanostructures to be collimated in the far-field of the LED. These subwavelength nanoparticles collectively behave as an optical collimating element or as a thin, flat optical lens used to collimate the light output from the LED. This eliminates the need for an external reflector and lens combination, thereby dramatically reducing the thickness of the LED package. The subwavelength nanostructures may be referred to herein as scattering elements and/or scattering antennas.

FIG. 1 illustrates an arrangement 100 of subwavelength scattering antennas or nanostructures placed on top of an LED die 110 functioning to collimate the light emitted by the LED in the far-field. The arrangement 100 of subwavelength scattering antennas may form an array of subwavelength scattering antennas 120. The LED die 110 produces light that has a Lambertian angular emission pattern. While FIG. 1 specifically depicts the LED die 110, the description herein includes, as would be understood by those possessing an ordinary skill in the art, a phosphor placed above the LED die 110 with the array 120.

An embedding medium 130 may be coupled to the LED die 110. This embedding medium 130 may take the form of a dielectric including, but not limited to, a silicon, such as polydimethylsiloxane (PDMS), a glass or acrylic, such as polymethyl methacrylate (PMMA), and silicon dioxide. The embedding medium 130 is designed to provide a host medium for each layer when using multiple layers. The general purpose for the embedding medium 130 is to mechanically hold the nanostructures. For example if the nanostructures are implemented as nanoparticles which are not fabricated by lithography techniques, the embedded medium 130 acts as a host medium. The embedding medium 130 may be a medium with tunable properties, such as liquid crystals, to tune the optical scattering properties of the nanostructures, or a medium with thermally variable refractive index to enable tuning of the scattering properties by temperature.

The subwavelength scattering antennas 120 may be designed within the embedding medium 130. These subwavelength scattering antennas 120 can either be placed in the near-field or far-field of the LED emission area and are specifically designed to interact with light emitted by the light source. The near-field and far-field are regions of the electromagnetic field around the led emission area. Non-radiative 'near-field' behaviors of the emission dominate close to the led emission area, while electromagnetic radiation 'far-field' behaviors dominate at greater distances. The sub-wavelength scattering antennas 120 can also be referred to as artificial electromagnetic and/or optical materials. These materials may be uniquely designed to interact with light in specific ways by engineering the structural and chemical parameters of the scattering antennas 120. Interaction refers to the light-matter interaction and specifically, the interaction of light and each nanostructure. The incident electric fields may induce dipoles (electric or/and magnetic) and multipoles (electric or/and magnetic) in the nanostructures which scatter the incident light in well-characterized directions. The structural parameters of the scattering antennas 120 may include shape, size, and periodicity, which may occur in one or two axes, for example.

These subwavelength scattering antennas 120 may be formed in an array extending generally in the x-y plane. The scattering antennas 120 may include, or may be, nanostructures. The array of scattering antennas 120 may act optically with a periodic structure, which splits and diffracts light into several beams travelling in different directions. The scattering antennas 120 may act on the amplitude and/or phase of the LED emitted light. The direction(s) of the output light depend upon the spacing, shape and size of the scattering antennas, and the wavelength of the light emitted by the LED. The various illustrations of the present system include the use of scattering antennas 120 used in transmission, although it would readily be understood that such scattering antennas 120 may also be used in reflection.

The area A on the plane, occupied by the scattering antennas 120, is chosen to be large and intersect as much light emitted by the LED as possible. However, the area A may be limited by the size of the LED, for example. The operating principle of the collimation layer is as follows: the subwavelength scattering antennas 120 are arranged as an array on the surface such that some of the structural attributes of the scattering antennas 120 vary spatially with the area A or by parts of the area A. The structural attributes may include: sizes in any dimension, shapes in any dimension and spacing between neighboring subwavelength scattering antennas 120, or a combination thereof.

The shape may include rectangles, squares, pyramids, triangles, cubiods, cylinders and other shapes with 2D cross-sections including square, rectangular, circular, elliptical, hexagonal and the like. The shapes may include a varying size as the scattering antennas 120 proceed outward from the center of the LED die as shown, for example. The shape may vary with a structural parameter, for example the side or radius as a function of (x,y). By way of non-limiting example only, the centered scattering element may be selected to be a certain shape, with the one immediately adjacent thereto, in both axes, be 110% of the size in the z-axis with the same footprint in the x and y axes. This pattern may continue until the edge of the LED die 110.

The size may include various dimensions of the aspects of the scattering antennas 120 and may be designed to interact with the light from the LED die 110 in specific ways. The size may vary with a structural parameter, for example the side or radius as a function of (x,y). By way of example only, the center structure of the scattering antennas 120 may be the largest in x and y axis footprint, and then each structure progressing outward therefrom may have an x/y axis footprint of 90% until the edge of the LED die 110 is reached.

The periodicity of the scattering antennas 120 may also be varied. The variation may include changing the periodicity of the scattering antennas 120 by a certain factor either creating additional spacing or shrinking the spacing of progressive scattering antennas 120 radiating outward to the edge of the LED die 110. The scattering antennas 120 may be arrayed with suitably designed periodicities in the x,y spatial dimensions. The scattering element may include nanostructures with certain periodicity in the z-direction, such as hyperbolic metamaterials, for example.

The chemical parameters of the scattering antennas 120 may include the materials used. As would be understood by those possessing an ordinary skill in the art, the chemical variation in the scattering antennas 120 may enable a selection of refractive index and loss for scatterer thereby changing scattered light amplitude and phase. Such a variation may be used in the design of the subwavelength scattering antennas 120 to produce the appropriate effect on the light emitted from the LED die 110.

Examples of devices that use these subwavelength scattering antennas 120 include meta-materials, photonic crystals and meta-surfaces. The choice of materials could include, but not limited to, metals (including but not limited to gold, silver, copper, aluminum) and dielectrics (including but not limited to silicon, silicon dioxide, titanium dioxide, gallium arsenide, aluminum gallium arsenide) and hybrid metallo-dielectric material combinations used to achieve low-loss plasmonics in the visible wavelength regime. These subwavelength scattering antennas 120 collectively behave as an optical collimating element. This eliminates the need for an external reflector and lens combination thereby dramatically reducing the thickness of the LED package.

The implementation of the arrangement of the subwavelength scattering antennas 120, as well as the shape, size and material properties of each element in the array may be dependent on the position of the array with respect to that of the LED top surface and the desired output collimation profile, the range of operating wavelengths and also any fabrication considerations and restrictions. Due to the variation in the optical field distribution away from the emitter region of LED, (with the field distribution at any plane a function of the x,y,z position of the plane), the interaction of the array with the photons incident on thereon will vary and be a function of the z position of the scattering antennas 120. Therefore, a particular design may be adapted to collimate light by varying its structural and material properties depending on the distance of the scattering element array from the LED emitter region while considering reflections from the LED top surface.

Each subwavelength scattering element 120 behaves as a nanoscale antenna and scatters incident light, from a certain range of incident angles, to certain directions with known amplitudes and phases. The scattering antennas as a group may be designed to select directions of scatter, or otherwise cause directions of scatter, to provide collimated light output. By suitably arranging a large number of such scattering antennas on or close to the surface of an LED in the z-axis, the light incident on the array of subwavelength scattering antennas 120 can be collimated to the far-field. The design of the subwavelength scattering antennas 120 with spatially varying parameters is dependent on the knowledge of field distributions of the light incident on the scattering element array. The subwavelength scattering antennas array 120 behaves optically as a nanoscale collimating thin film lens used to collimate the light emitted by the LED.

Figure 2:
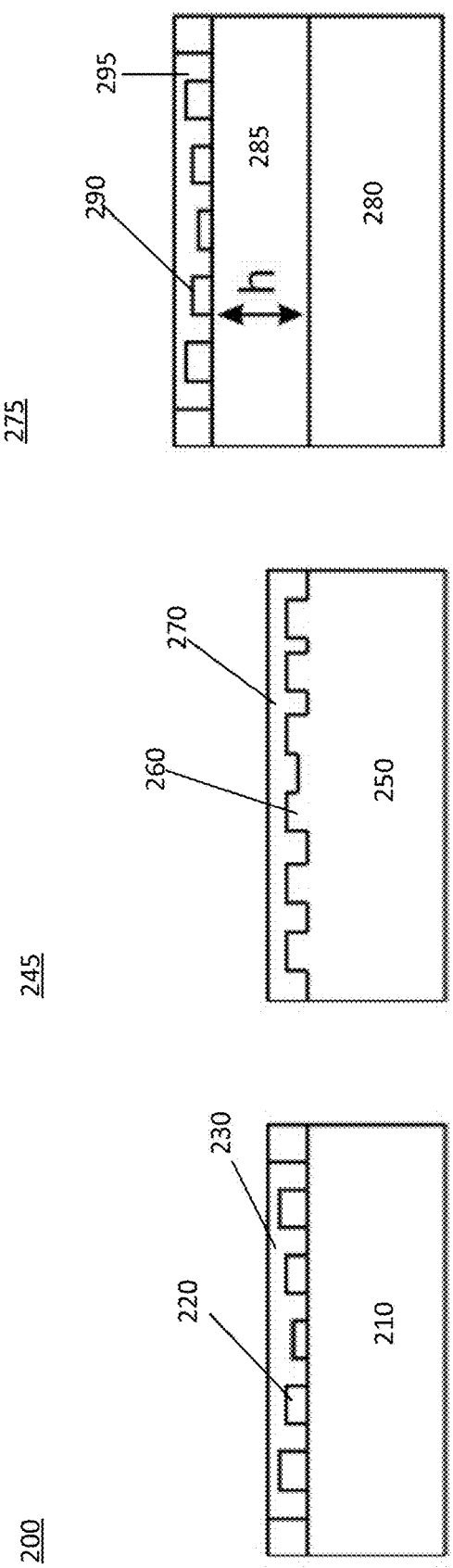
FIG. 2 generally illustrates example arrangements of arrays of subwavelength scattering antennas including FIG. 2a where the array is placed on top of the LED top surface, FIG. 2b where the array is submerged and/or partially submerged in/on the LED top surface, and FIG. 2c where the array is offset from the LED top surface using a dielectric spacer placed between the array and the LED top surface.

FIG. 2 illustrates several example arrangements of arrays of subwavelength scattering antennas including FIG. 2a where the array 220 is placed on top of the LED 210 top surface, FIG. 2b where the array 260 is submerged and/or partially submerged in or on the LED 250 top surface, and FIG. 2c where the array 290 is offset from the LED 280 top surface using a dielectric spacer 285 placed between the array 290 and the LED 280 top surface.

In FIG. 2a, the array of subwavelength scattering antennas 220 is coupled to the LED 210 top surface. That is, the array 220 is placed adjacent in the z-axis to the surface of the LED 210 in an embedding medium 230. The spatial positioning of the array 220 adjacent to the top surface of the LED 210 may be used to as a group to select directions of scatter, or otherwise cause directions of scatter, to provide collimated light output. Additionally, this spatial positioning may provide further benefits including other beamforming configurations.

In FIG. 2b, the array of subwavelength scattering antennas 260 is submerged, either completely or partially, in or on the LED 250 top surface. That is, the array 260 is placed within or partially within the LED 250 top surface in the z-axis direction covered by or partially covered by an embedding medium 270. This spatial positioning of the array 260 at least partially, or completely, within the LED 250 substrate may be used to select directions of scatter, or otherwise cause directions of scatter, to provide collimated light output. In particular, placing the array 260 within or partially within the LED 250 substrate may eliminate or at least control with respect to spurious scattering, and other inputs into the collimation design, from the LED 250 top surface.

In FIG. 2*c*, the array of subwavelength scattering antennas 290 is offset from the LED 280 top surface. This offset may be in the z-axis direction. The offset may occur by placing a dielectric spacer 285 between the array 290 and the LED 280 top surface in the z-axis in an embedding medium 295. The thickness in the z-axis, denoted as h, of the dielectric spacer 285 may determine the positioning in the z-axis of the array 290. This spatial positioning of the array 290 spaced apart from the LED 280 substrate may be used to select directions of scatter, or otherwise cause directions of scatter, to provide collimated light output. In particular, spacing the array 290 from the LED 280 top surface using a dielectric spacer 285 may control the input of reflections from the LED 280 top surface and may enable another factor into the process by selection of the dielectric spacer 285. The spacer 285 may be utilized to aid in the fabrication of the assembly, for example in a configuration where the lens is to be fabricated on top of the phosphor.

This choice of the dielectric spacer 285 size and material provides additional variables that may be adjusted to provide or enhance the collimation in the far field of the produced light. The choice of the dielectric material may also enable a better transition with the embedding medium 295, thereby operating as a transition from the LED 280 substrate to embedding medium 295 instead of the situation in FIG. 2*a* where the embedding medium 230 and LED 210 substrate as substantially contacting and produce an interface that the light propagates through. As would be understood, such spacing may consume additional space in the package. Additionally, this spatial positioning may provide further benefits including an improvement in extraction efficiency of light from the LED.

Additionally, scattering antennas may be arranged in multiple layers (not shown) with the possibility of dielectric spacers between layers designed to aid in the selection of light scatter. The additional layers may be used to provide operation over broad parameter ranges by splitting some parameters into each layer where parameter may be wavelength and/or polarization, for example, correction of any aberration errors, and addition of any multi-functionality to the collimating structure.

Figure 3:
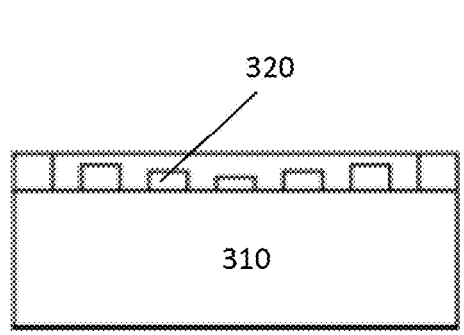
FIG. 3 generally illustrates example arrangements of arrays of subwavelength scattering element including FIG. 3a where the array is placed on top of an LED top surface, FIG. 3b where the array is placed on the top surface of an LED with z offsets between individual scattering antennas, FIG. 3c where multiple arrays are placed on the LED surface with each array having different arrangement of scattering antennas without gaps between each of the layers, and FIG. 3d where multiple arrays are placed on the LED surface with each array having different arrangement of scattering antennas with dielectric spacers between layers of designed thicknesses.
Figure 3:
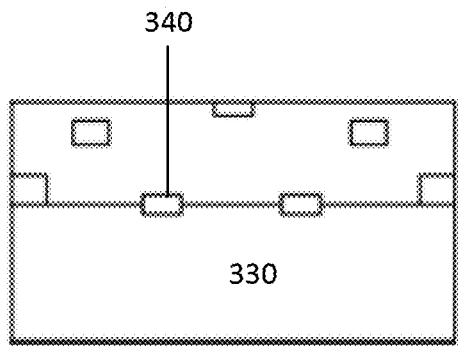
Figure 3:
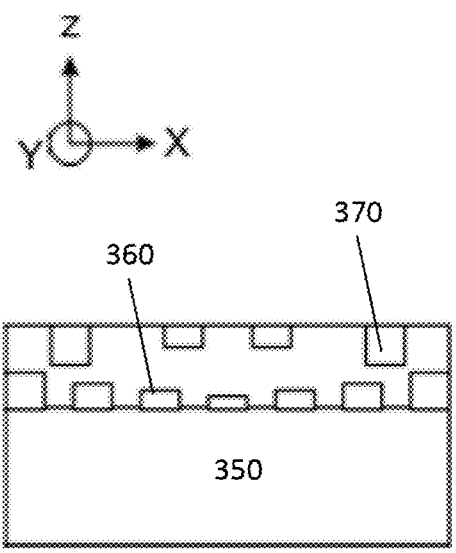
Figure 3:
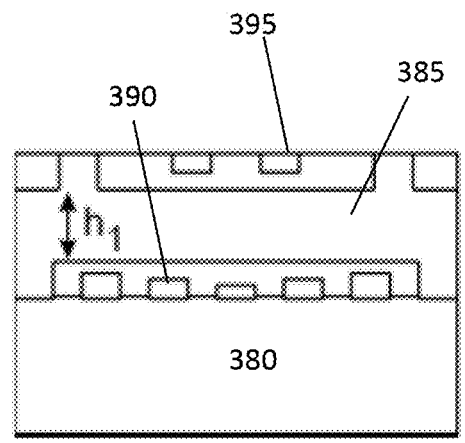

Some or all of the successive layers of scattering antennas may also be placed directly adjacent to other layers. The individual scattering antennas may have offsets in the z-axis with other scattering antennas, although generally, scattering antennas lie on a plane parallel to the LED top surface. FIG. 3 illustrates several example arrangements of arrays of subwavelength scattering element including FIG. 3*a* where the array 320 is placed on top of LED 310 top surface, FIG. 3*b* where the array 340 is placed on top surface of LED 330 with z offsets between individual scattering antennas, FIG. 3*c* where multiple arrays 360,370 are placed on the LED 350 surface with each array having different arrangement of scattering antennas without gaps between each of the layers, and FIG. 3*d* where multiple arrays 390,395 are placed on LED 380 surface with each array having different arrangement of scattering antennas with dielectric spacers 385 between layers of designed thicknesses.

FIG. 3*a* illustrates a single array of scattering antennas 320 positioned adjacent to the top surface of the LED 310 substrate. This provides a base example from which the additional examples of FIG. 3 are derived as the gaps between different arrays can be zero or greater than zero.

FIG. 3*b* illustrates a single array of scattering antennas 340 where ones of the scattering antennas within the array are displaced to different positions (incorporating z-axis offsets) within the light output from the LED. As is shown in FIG. 3*b*, several of the scattering antennas 340 are partially submerged within the LED 330 substrate. As would be understood, although not shown, ones of the elements may be completely submerged in the LED 330 substrate. Several of the scattering antennas 340 are positioned adjacent to the LED 330 substrate, similar to their respective position in FIG. 3*a*. Several of the scattering antennas 340 are also displaced in the z-axis a distance from the top surface of the LED 330 substrate. Others of the scattering antennas 340 are displaced in the z-axis to a different distance from the top surface of the LED 330 substrate.

FIG. 3*c* illustrates multiple arrays of scattering antennas 360,370 (two arrays are shown) placed on the LED 350*v* top surface with each array having a different arrangement of scattering antennas, although the same arrangement may be used, without gaps between the arrays. Generally, the first array 360 may be positioned identically to that depicted in FIG. 3*a*. The second array 370 may be positioned adjacent to the first array 360.

FIG. 3*d* illustrates multiple arrays of scattering antennas 390,395 (again two arrays are shown). Each array 390,395 may have a different arrangement of scattering antennas, although the same arrangement may be used. Generally, the first array 390 may be positioned identically to that depicted in FIG. 3*a*. The second array 395 may be positioned offset from the first array 390 in the z-axis by a distance $h_1$. If more arrays are used, the spacing between arrays may be the same or may vary such as by including a distance $h_2$ between the second and third arrays, for example.

Figure 4:
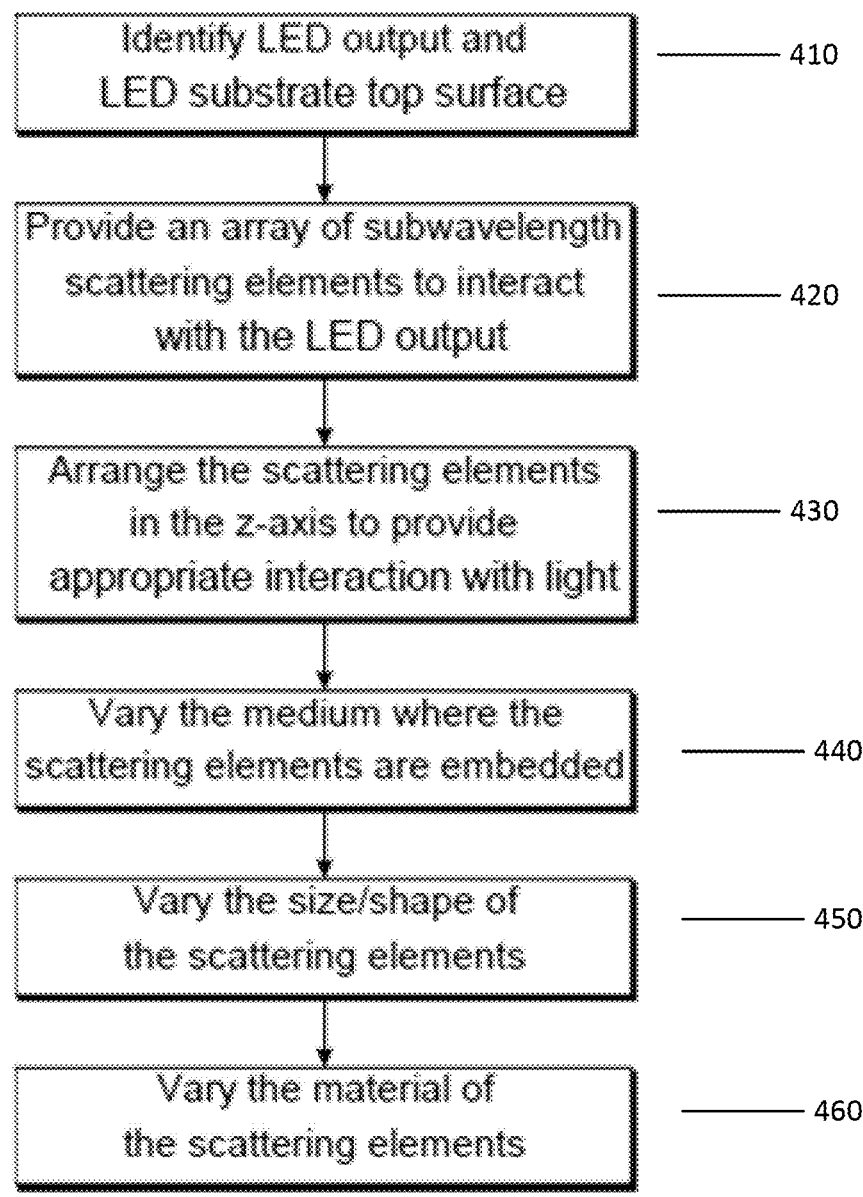
FIG. 4 illustrates a method of collimating the light output from an LED substrate.

FIG. 4 illustrates a method 400 of collimating the light output from an LED substrate. The method includes the steps of identifying the LED output and LED substrate top surface at step 410. The method further includes providing an array of subwavelength scattering antennas to interact with the light output by the LED at step 420. The method may include arranging the scattering antennas in the z-axis to provide an appropriate interaction with the light to product collimated light in the far-field at step 430. The method may include varying the medium where the scattering antennas are embedded from the selection of the LED substrate, an embedding medium and a dielectric spacer, and including partial embedding within this substrate at step 440. The method may also include varying the size and/or shape of the scattering antennas to provide the desired effect of the output light at step 450. The method may also include varying the material of the scattering antennas to provide the desired effect of the output light at step 460.

The scattering antennas are designed in such a way that the light at the far-field of the LED is (substantially) collimated when compared to an LED without the scattering antennas. Each element may be selected to cause the scattering to impart a certain amplitude and phase to the light. Therefore, the scattering antennas may be implemented using many different designs.

The scattering antennas may be broadly categorized based on mode of operation as a resonant scatterer or a non-resonant scatterer. A resonant scatterer supports an electromagnetic resonance for a given set of structural, material parameters and a given wavelength. For example, the scattering antennas may support Mie resonances including electric and magnetic dipole and quadrapole resonances. By way of example, such scattering antennas may include silicon nanopillars supporting both electric and magnetic dipoles.

Alternatively, the scattering antennas may be a non-resonant scatterer. This scattering element may affect the amplitude and phase of the scattered light by different means, like, for example, by use of waveguiding modes. In this case, each scattering element may provide a different phase shift to the incident wave as it propagates through the scattering antennas. The scattering antennas as a whole tune the amplitude and phase of the incident wave as it propagates through the array. In both cases, the amplitude and phase variations in the scattered field may be obtained by, for example, varying the dimensions of the scattering antennas based on a certain pattern or profile.

A series of examples of application of scattering antennas to collimate light from an LED are illustrated in the collectively referred to FIG. 5. In FIG. 5a, the LED architecture may include a semiconducting layer 502, such as gallium nitride (GaN) and a sapphire substrate 504. Although not shown in FIG. 5a, a phosphor layer may also be included between the sapphire substrate 504 and the scattering antennas 506. In the final device, the emitted light exits from the semiconducting layer 502 into the sapphire substrate 504 and finally to the ambient medium. As shown in FIG. 5a, the scattering antennas 506 may be disposed on top of the sapphire substrate 504. In FIG. 5a, the sapphire substrate 504 is larger than the size of the semiconductor layer 502.

The scattering antennas 506 may include a high dielectric constant (or high refractive index) and low loss material, such as titanium dioxide, gallium nitride, silicon nitride, amorphous or crystalline silicon at near IR wavelengths, and the like, for example. The low loss properties of the materials provide high transmission efficiency for the device. Titanium dioxide may be used as the material to implement non-resonant scattering antennas 506. The refractive index of the material to implement the scattering antennas 506 may have a refractive index of at least 2.5 with a loss less than $1 \times 10^{-3}$.

Specifically, the scattering antennas 506 may include titanium dioxide for use at wavelengths of 450 nm and 620 nm with a refractive index of approximately 2.5 with loss less than $1 \times 10^{-3}$ Alternatively, silicon may be utilized as the scattering antennas 506 for near infrared (NIR) applications in mobile devices (such as for face recognition and iris recognition, for example) with a refractive index of approximately 3.66 (in the range of 3.6 to 3.7) and loss less than $3 \times 10^{-3}$.

Figure 5A:
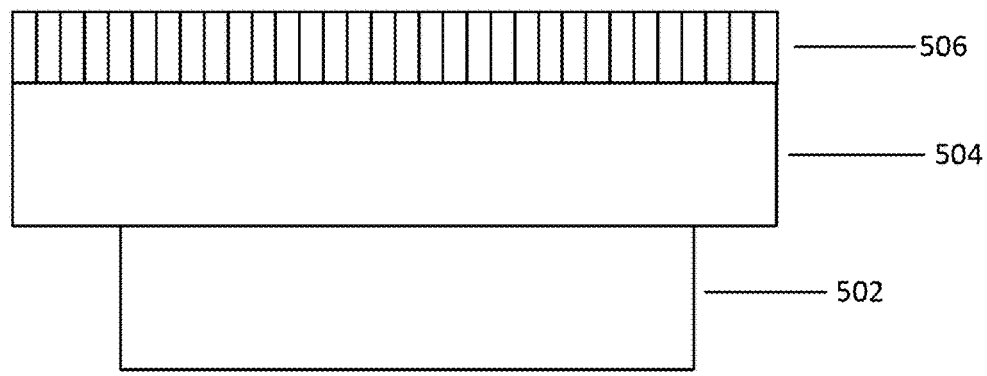
FIG. 5a illustrates an example of application of scattering antennas to collimate light from an LED.

The scattering element pattern may be arranged in rectangular or hexagonal lattices. In the example of FIG. 5a, the pattern may be arranged in a rectangular lattice. The lattice period may be smaller than 400 nm. In the example of FIG. 5a, the lattice period may be 250 nm. The radius of the rods within the scattering antennas may vary from 40 nm to 110 nm. The upper and lower bounds of the radii used may be dictated by fabrication tolerances and the design may be varied to accommodate fabrication tolerances. In the non-resonant device design, the height of the scattering antennas 506 may be several 100 nm and limited by rod aspect ratio that may be achieved through practical means. In one particular design, the height of the nanostructures may be less than 700 nm. This particular design may have a wavelength centered on 620 nm. The design concepts may be extended to other wavelengths including visible light for both narrow band and broadband (white light) operation. In the example, the thickness of the sapphire substrate 504 may be selected to be 100 um, but as would be understood from the present description, the thickness may be varied and limited by fabrication and handling procedures. The choice of different materials and fabrication process may allow for use of thinner materials for the substrate 502. In one example, the focal length of the collimating nanostructure array 506 may be defined to be 100 um. The focal length may be designed to structure images of the active light regions of the LED chip.

In the examples of FIG. 5, the radius of the rods may be varied as a function of position (x,y) along the sapphire substrate. The rod radius may be varied as function of (x,y) such that the resulting light in the far-field is collimated. Alternatively, instead of varying the radius as (x,y), the radius may be held constant and height may be varied as a function of (x,y). This design results in the array of scattering antennas 506 functioning as a collimating lens. The radii of the titanium scattering antennas 506 may be selected to provide an overall phase distribution $\phi(x,y)$ of the structure resembling that of a collimating lens. This affect may be achieved by choosing to vary the radius of each rod in the array of scattering antennas 506 to control the amplitude and phase of the light scattered by the rod.

By way of example only, designs of the non-resonant scattering antenna 506 may include both rectangular and hexagonal lattice with one antenna per unit cell. The structure may be fabricated on top of the sapphire substrate 504 with a background medium of air. The focal length may be designed to structure images from the active light emitting regions of the LED chip. For example, there may be a device 500 designed at 450 nm with a periodicity of 250 nm using titanium dioxide non-scattering antennas 506 of height 600 nm with the radii varying spatially from 25 nm to 110 nm. Another design at 620 nm may be used for the red color emitting LEDs that emit red without use of phosphor. Such a device 500 may include a periodicity of 300 nm with titanium dioxide non-scattering antennas 506 of height 700 nm with radii varying spatially from 25 nm to 130 nm.

By way of additional examples, designs of the resonant scattering antenna 506 may include both rectangular and hexagonal lattice with one antenna per unit cell. The operating wavelength may be 850 nm with a periodicity of 400 nm using rods of height 150 nm with radii varying from 25 nm to 180 nm. A glass substrate may be used.

These antenna layers can reduce the need for external lens to collimate light, be used to narrow the radiation profile emitted by the LED in order to provide increased efficiency in coupling light to external optics to thereby improving the overall system efficiency. This technique may be applied to applications for existing LED structures which use either bulk reflective material or thin reflective layers on the side of the LED.

Figure 5B:
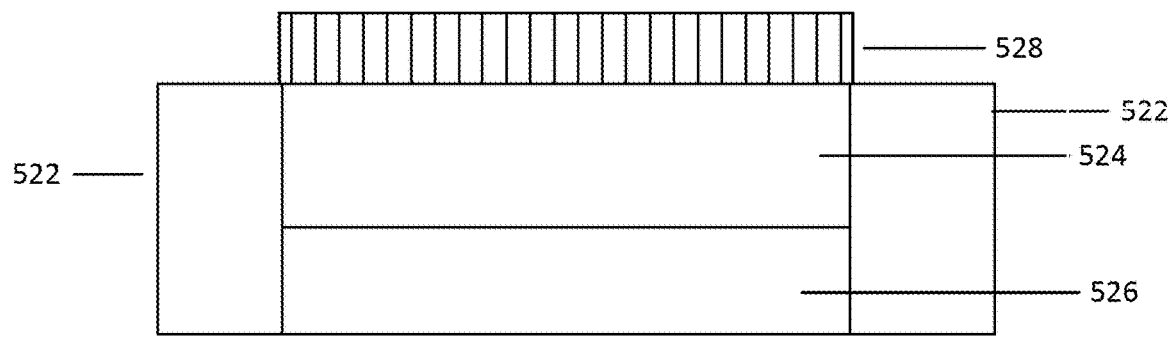
FIG. 5b illustrates a device designed as an LED with bulk reflective material and no phosphor layers.

FIG. 5b through FIG. 5e provide additional examples of devices incorporating the scattering antennas. In FIG. 5b, there is a device 520 designed as an LED with bulk reflective material and no phosphor layers. Device 520 includes a bulk reflective material 522 positioned at the ends of the core of the device 520. The core of the device 520 includes a sapphire substrate 524 that is situated between a LED chip 526 and scattering antennas (nanostructured layer) 528. The LED 520 emits light at certain colors/wavelengths, such as InGaN LEDs emitting blue, green color.

Figure 5C:
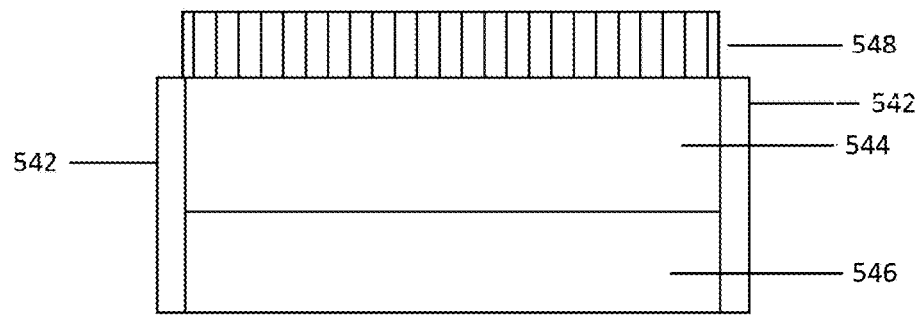
FIG. 5c illustrates an LED with a side reflective coating and no phosphor.

FIG. 5c illustrates an LED 540 with a side reflective coating 542 and no phosphor. Device 540 includes a side reflector 542 positioned at the ends of the core of the device 540. The side reflector 542 may include a bragg grating, dielectric mirrors, metallic mirrors, for example. The core of the device 540 includes a sapphire substrate 544 that is situated between a LED chip 546 and scattering antennas (nanostructured layer) 548. The LED 540 emits light at certain colors/wavelengths, such as InGaN LEDs emitting blue, green color.

The nanostructured layers 548 may be applied to the top of the phosphor 550 in order to collimate the light emitted from the phosphor 550. The phosphor 550 may be selected to emit broadband yellow light (as in the case of white LED—white is blue+yellow) or completely convert all blue light from LED chip 546 to emit in a narrow band of wavelength/s (for example LEDs that emit amber, deep red colors). The nanostructure layer 548 can be designed to either collimate white light (yellow+blue) or certain specific colors/wavelengths.

Figure 5D:
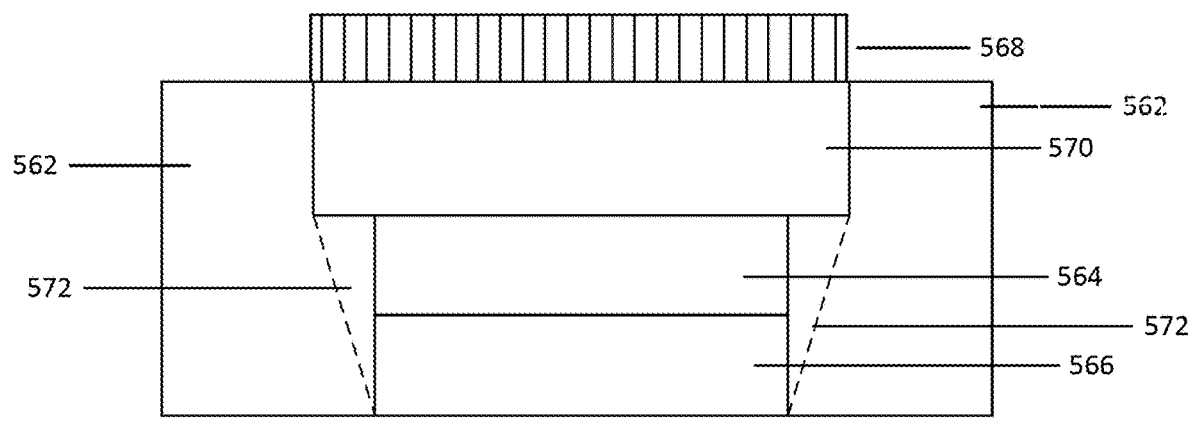
FIG. 5d illustrates an LED with a bulk reflective material and a phosphor layer.

FIG. 5d illustrates an LED 560 with a bulk reflective material 562 and a phosphor layer 570. Device 560 includes bulk reflective material 562 positioned at the ends of the core of the device 560. The core of the device 560 includes a sapphire substrate 564 that is situated between a LED chip 566 and phosphor layer 570 and scattering antennas (nanostructured layer) 568 may be adjacent to phosphor layer 570 distal to sapphire substrate 564. Additional silicone wings 572 may be utilized underlying the phosphor layer 570 extending beyond the sapphire substrate 564 and LED chip 566.

The nanostructured layers 568 may be applied to the top of the phosphor 570 in order to collimate the light emitted from the phosphor 570. The phosphor 570 may be selected to emit broadband yellow light (as in the case of white LED—white is blue+yellow) or completely convert all blue light from LED chip 566 to emit in a narrow band of wavelength/s (for example LEDs that emit amber, deep red colors). The nanostructure layer 568 can be designed to either collimate white light (yellow+blue) or certain specific colors/wavelengths.

Figure 5E:
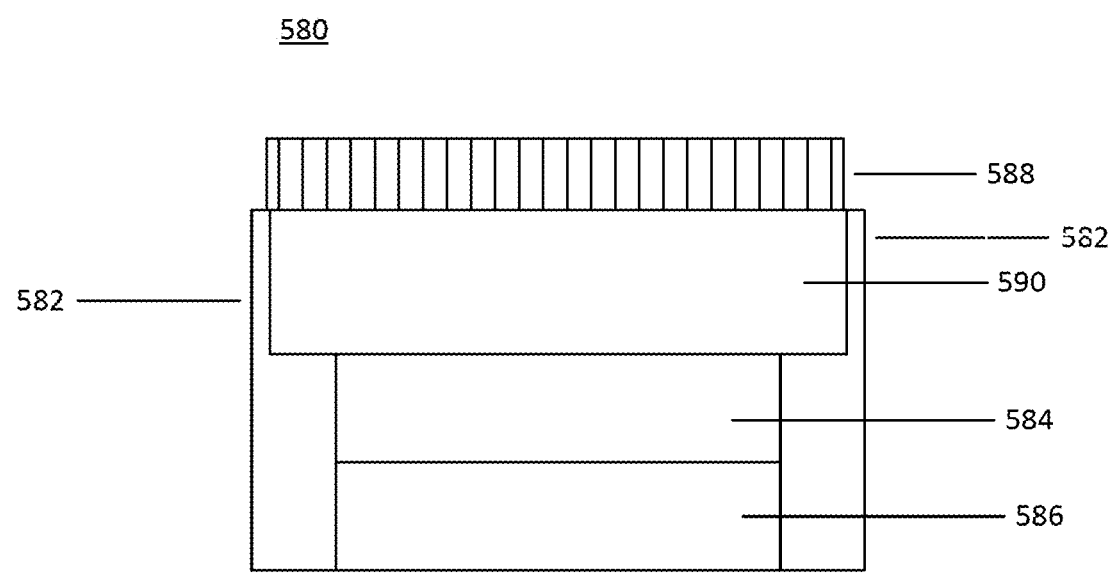
FIG. 5e illustrates an LED with side reflective coating and a phosphor layer.

FIG. 5e illustrates an LED 580 with side reflective coating 582 and a phosphor layer 590. Device 580 includes a side reflective coating 582 positioned at the ends of the core of the device 580. The side reflector 582 may include a bragg grating, dielectric mirrors, metallic mirrors, for example. The core of the device 580 includes a sapphire substrate 584 that is situated between a LED chip 586 and phosphor layer 590 and scattering antennas (nanostructured layer) 588 may be adjacent to phosphor layer 590 distal to sapphire substrate 584.

Figure 6:
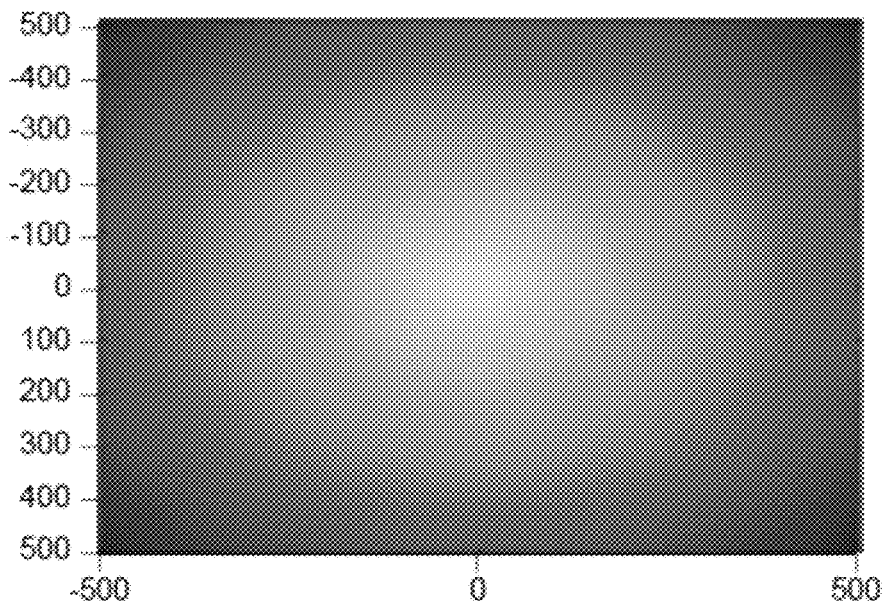
FIG. 6 illustrates a plot of the phase distribution $\phi(x,y)$ of the scattering antennas over the LED size of 1 mm×1 mm.
Figure 7:
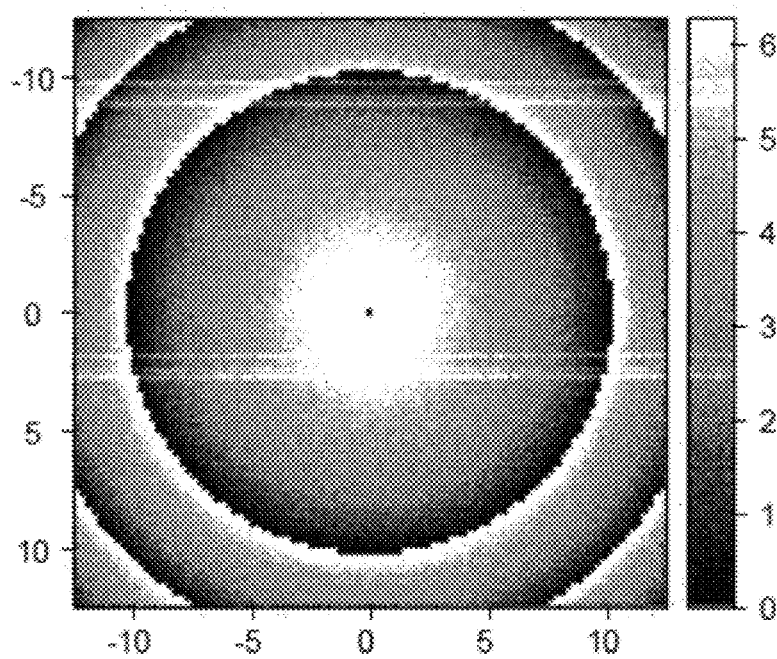
FIG. 7 illustrates a plot of the phase distribution $\phi(x,y)$ of the scattering antennas over a smaller area of 25 um×25 um (smaller when compared to the dimensions of the LED which are typically 1-2 mm per side as shown in FIG. 6)

FIG. 6 illustrates a plot 600 of the phase distribution $\phi(x,y)$ of the scattering antennas over the LED size of 1 mm×1 mm. FIG. 7 illustrates a plot 700 of the phase distribution $\phi(x,y)$ of the scattering antennas over a smaller area of 25 um×25 um (smaller when compared to the dimensions of the LED which are typically 1-2 mm per side as shown in FIG. 6). FIG. 6 and FIG. 7 collectively illustrate how the wave is retarded at different location (x,y) and further demonstrate that there is a collimated beam or otherwise may demonstrate beam forming.

Figure 8:
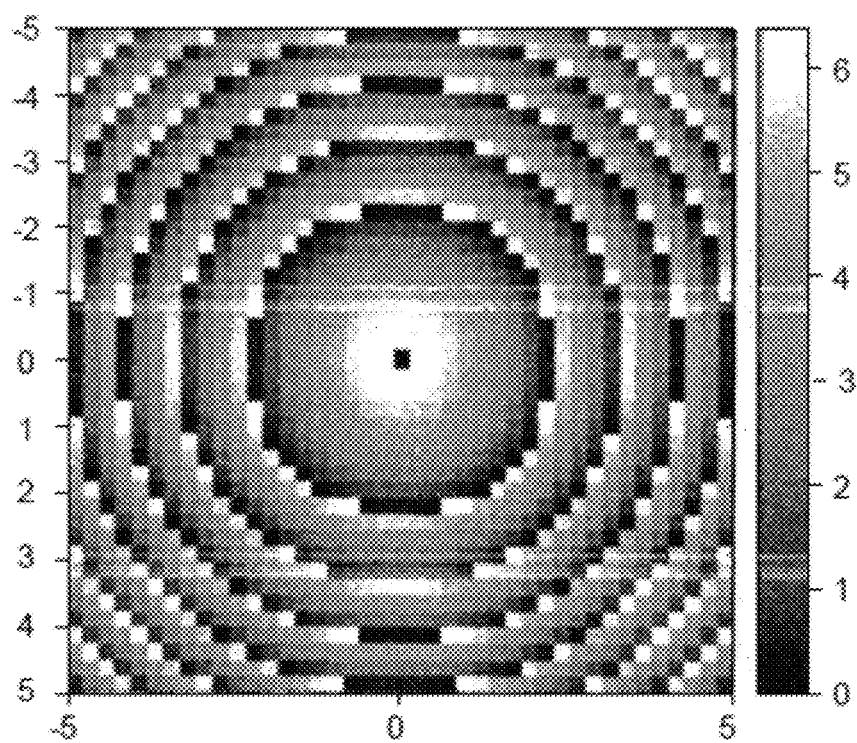
FIG. 8 illustrates a plot of the phase function of the scattering antennas.
Figure 9:
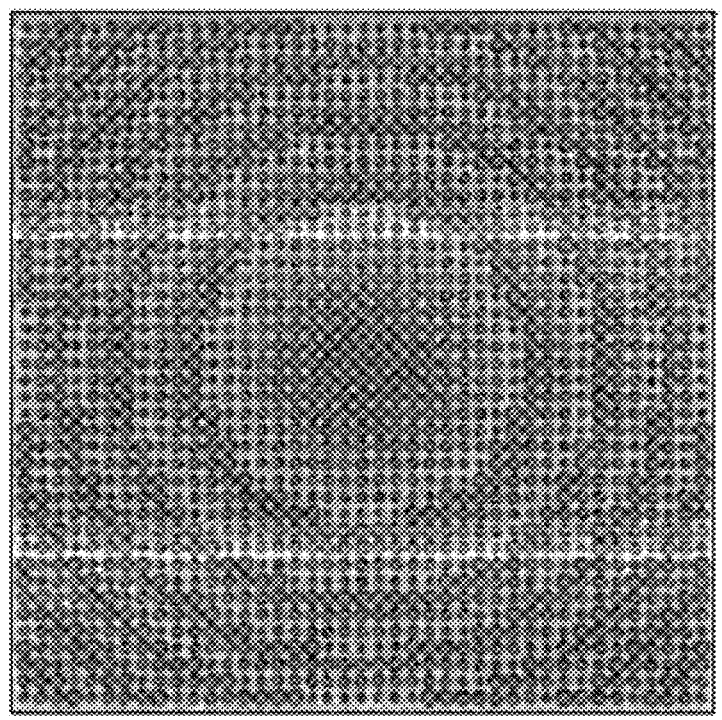
FIG. 9 illustrates a top view of the arrangement of the scattering antennas over a smaller area of 10 um×10 um on a sapphire substrate corresponding to the phase distribution plot of FIG. 7.

FIG. 8 illustrates a plot 800 of the phase function of the scattering antennas. FIG. 9 illustrates a top view 800 of the arrangement of the scattering antennas over a smaller area of 10 um×10 um on a sapphire substrate corresponding to the phase distribution plot 800 of FIG. 8. The rod radii and arrangement have been selected to provide the behavior of a collimating lens with a focal length of 100 um. FIG. 9 illustrates the array of rods that approximately implements the phase distribution function described above. That is, the illustrated rod array approximately imparts phase delays to incident light as given by the phase distribution function. In this illustration, the radius of the rods may be varied as a function of position (x,y) along a substrate, such as sapphire. The rod radius is varied as a function of (x,y) such that the resulting light in the far-field is collimated. The resulting array of nanostructures behaves like a collimating lens. The radii of the titania nanorods are chosen such that the overall phase distribution $\Phi(x,y)$ of the structure resembles that of a collimating lens. This may be achieved by varying the radius of each rod in the array to control the amplitude and phase of the light scattered by the rod.

Figure 10:
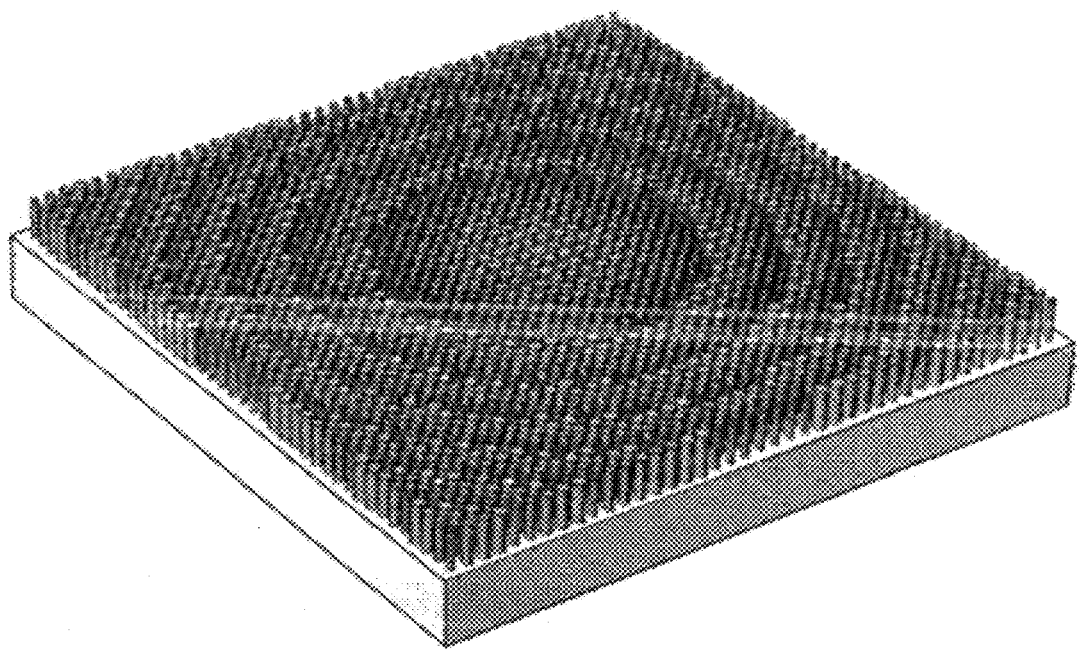
FIG. 10 illustrates a zoomed-in image of the scattering antennas.

FIG. 10 illustrates a zoomed-in image 1000 of the scattering antennas. FIG. 9 illustrates the phase function of FIG. 8 and depicts how the phase function carries into the structure of the scattering antennas. By comparing the two figures, one readily concludes the relationship.

Figure 11:
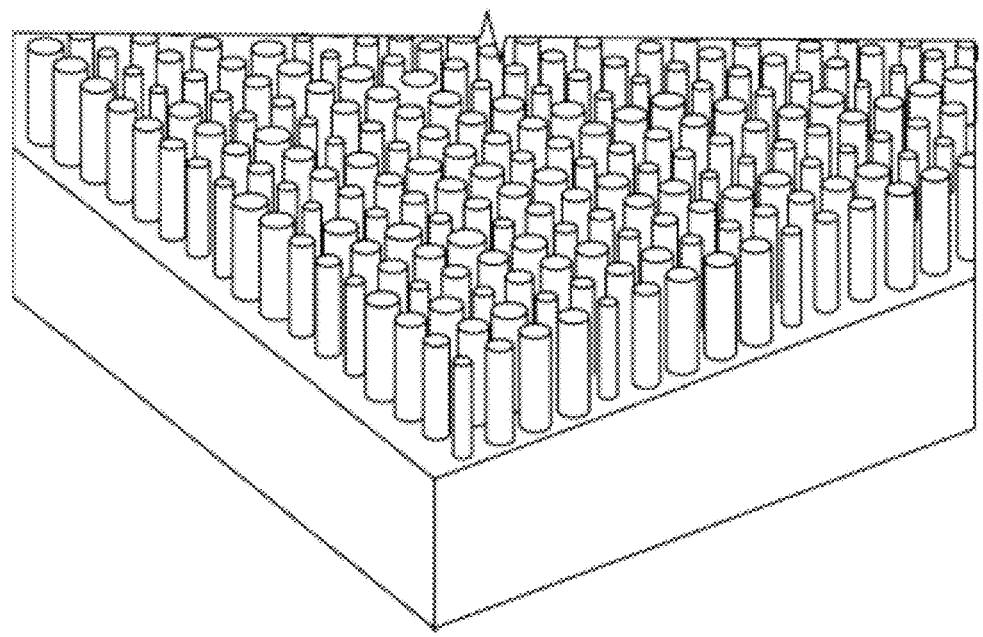
FIG. 11 illustrates a further zoomed-in image of the scattering antennas.

FIG. 11 illustrates a further zoomed-in image 1100 of the scattering antennas. There is shown a series of rods that are arranged in periodic fashion. FIG. 11 illustrates a periodic arrangement of rods with spatially varying dimensions with the same constant height.

Although features and elements are described above in particular combinations, one of ordinary skill in the art will appreciate that each feature or element can be used alone or in any combination with or without the other features and elements. In addition, the methods described herein may be implemented in a computer program, software, or firmware incorporated in a computer-readable medium for execution by a computer or processor. Examples of computer-readable media include electronic signals (transmitted over wired or wireless connections) and computer-readable storage media. Examples of computer-readable storage media include, but are not limited to, a read only memory (ROM), a random access memory (RAM), a register, cache memory, semiconductor memory devices, magnetic media such as internal hard disks and removable disks, magneto-optical media, and optical media such as CD-ROM disks, and digital versatile disks (DVDs).

What is claimed is:

1. A light emitting device comprising:
a light emitting diode comprising a light emitting surface through which light is emitted in operation of the light emitting device; and
at least a first array of light scattering antennas arranged in a plane parallel to the light emitting surface, each light scattering antenna having dimensions in the plane of the first array less than or equal to a free space wavelength of light emitted by the light emitting diode, the light scattering antennas having structural, optical, or structural and optical properties that vary with the spatial location of the light scattering antennas in the plane of the first array to affect phase and amplitude of light emitted through the light emitting surface in a spatially varying manner that collimates or partially collimates the light emitted through the light emitting surface.

2. The light emitting device of claim 1, wherein a spacing between the light scattering antennas varies with the spatial location of the light scattering antennas in the plane of the first array.

3. The light emitting device of claim 1, wherein shapes of the light scattering antennas vary with the spatial location of the light scattering antennas in the plane of the first array.

4. The light emitting device of claim 1, wherein sizes of the light scattering antennas vary with the spatial location of the light scattering antennas in the plane of the first array.

5. The light emitting device of claim 1, wherein refractive indices of the light scattering antennas vary with the spatial location of the light scattering antennas in the plane of the first array.

6. The light emitting device of claim 1, wherein the light scattering antennas have structural, optical, or structural and optical properties that vary with distance from a center of the first array of light scattering antennas.

7. The light emitting device of claim 1, wherein the light scattering antennas have dimensions perpendicular to the plane of the first array less than or equal to the free space wavelength of light emitted by the light emitting diode.

8. The light emitting device of claim 1, wherein the light scattering antennas are external to the light emitting diode and arranged on the light emitting surface.

9. The light emitting device of claim 1, wherein the light scattering antennas are located within the light emitting diode beneath the light emitting surface.

10. The light emitting device of claim 1, wherein the light scattering antennas are external to the light emitting diode and spaced apart from the light emitting surface.

11. The light emitting device of claim 1, comprising a second array of light scattering antennas arranged parallel to and spaced apart from the first array of light scattering antennas, each light scattering antenna in the second array having dimensions in the plane of the second array less than or equal to the free space wavelength of light emitted by the light emitting diode, the light scattering antennas in the second array having structural, optical, or structural and optical properties that vary with the spatial location of the light scattering antennas in the plane of the second array to affect phase and amplitude of light emitted through the light emitting surface in a spatially varying manner that in combination with the first array of light scattering antennas collimates or partially collimates the light emitted through the light emitting surface.

12. The light emitting device of claim 11, wherein the light scattering antennas of the first array of light scattering antennas are external to the light emitting diode and arranged on the light emitting surface and the light scattering antennas of the second array of light scattering antennas are also external to the light emitting diode.

13. The light emitting device of claim 12, wherein:
the light scattering antennas of the first array of light scattering antennas have structural, optical, or structural and optical properties that vary with distance from a center of the first array of light scattering antennas; and
the light scattering antennas of the second array of light scattering antennas have structural, optical, or structural and optical properties that vary with distance from a center of the second array of light scattering antennas.

14. The light emitting device of claim 13, wherein:
the light scattering antennas of the first array of light scattering antennas have dimensions perpendicular to the plane of the first array of light scattering antennas less than or equal to the free space wavelength of light emitted by the light emitting diode; and
the light scattering antennas of the second array of light scattering antennas have dimensions perpendicular to the plane of the second array of light scattering antennas less than or equal to the free space wavelength of light emitted by the light emitting diode.

15. The light emitting device of claim 11, wherein the light scattering antennas of the first array of light scattering antennas are located within the light emitting diode beneath the light emitting surface.

16. The light emitting device of claim 15, wherein:
the light scattering antennas of the first array of light scattering antennas have structural, optical, or structural and optical properties that vary with distance from a center of the first array of light scattering antennas; and
the light scattering antennas of the second array of light scattering antennas have structural, optical, or structural and optical properties that vary with distance from a center of the second array of light scattering antennas.

17. The light emitting device of claim 16, wherein:
the light scattering antennas of the first array of light scattering antennas have dimensions perpendicular to the plane of the first array of light scattering antennas less than or equal to the free space wavelength of light emitted by the light emitting diode; and
the light scattering antennas of the second array of light scattering antennas have dimensions perpendicular to the plane of the second array less than or equal to the free space wavelength of light emitted by the light emitting diode.

18. The light emitting device of claim 11, wherein the light scattering antennas of the first array of light scattering antennas are external to the light emitting diode and spaced apart from the light emitting surface and the light scattering antennas of the second array are also external to the light emitting diode.

19. The light emitting device of claim 18, wherein:
the light scattering antennas of the first array of light scattering antennas have structural, optical, or structural and optical properties that vary with distance from a center of the first array of light scattering antennas; and
the light scattering antennas of the second array of light scattering antennas have structural, optical, or structural and optical properties that vary with distance from a center of the second array of light scattering antennas.

20. The light emitting device of claim 19, wherein:
the light scattering antennas of the first array of light scattering antennas have dimensions perpendicular to the plane of the first array of light scattering antennas less than or equal to the free space wavelength of light emitted by the light emitting diode; and
the light scattering antennas of the second array of light scattering antennas have dimensions perpendicular to the plane of the second array less than or equal to the free space wavelength of light emitted by the light emitting diode.

* * * * *